(12) United States Patent
Schlott et al.

(10) Patent No.: US 11,125,708 B2
(45) Date of Patent: Sep. 21, 2021

(54) SILVER ALLOY-BASED SPUTTER TARGET

(71) Applicant: Materion Advanced Materials Germany GmbH, Hanau (DE)

(72) Inventors: Martin Schlott, Offenbach (DE); Christoph Simons, Biebergemund (DE); Albert Kastner, Hanau (DE); Jens Wagner, Frankfurt (DE); Uwe Konietzka, Geiselbach (DE)

(73) Assignee: Materion Advanced Materials Germany GmbH, Hanau (DE)

( * ) Notice: Subject to any disclaimer, the term of this patent is extended or adjusted under 35 U.S.C. 154(b) by 0 days.

(21) Appl. No.: 15/771,528

(22) PCT Filed: Nov. 8, 2016

(86) PCT No.: PCT/EP2016/076909
§ 371 (c)(1),
(2) Date: Apr. 27, 2018

(87) PCT Pub. No.: WO2017/080968
PCT Pub. Date: May 18, 2017

(65) Prior Publication Data
US 2018/0340904 A1    Nov. 29, 2018

(30) Foreign Application Priority Data
Nov. 10, 2015 (EP) .................................... 15193862

(51) Int. Cl.
*B22D 21/00* (2006.01)
*G01N 27/06* (2006.01)
(Continued)

(52) U.S. Cl.
CPC ............... *G01N 27/06* (2013.01); *C22C 5/06* (2013.01); *C23C 14/185* (2013.01); *C23C 14/3414* (2013.01); *H01J 37/3426* (2013.01)

(58) Field of Classification Search
CPC .................................................. H01J 37/3432
See application file for complete search history.

(56) References Cited

U.S. PATENT DOCUMENTS

2004/0226818 A1* 11/2004 Takagi ................ C23C 14/3414
                                                         204/298.13
2004/0238356 A1* 12/2004 Matsuzaki ................ C22C 5/06
                                                         204/298.13
(Continued)

FOREIGN PATENT DOCUMENTS

EP       1889931 A1    2/2008
JP   2004-002929 A    1/2004
(Continued)

OTHER PUBLICATIONS

Microscope World, "Microscope Magnification", 2019. (Year: 2019).*
(Continued)

*Primary Examiner* — Seth Dumbris
*Assistant Examiner* — Kim S. Horger
(74) *Attorney, Agent, or Firm* — Cozen O'Connor (57) ABSTRACT

The present invention relates to a sputtering target, comprising a silver alloy comprising
a first element, selected from indium, tin, antimony and bismuth, in an amount of 0.01 to 2 wt. %, based on the total weight of the silver alloy, and
0.01 to 2 wt. % titanium, based on the total weight of the silver alloy, and
having an average grain size of no more than 55 μm.

16 Claims, 6 Drawing Sheets

(51) Int. Cl.
    *C23C 14/34*     (2006.01)
    *C22C 5/06*     (2006.01)
    *H01J 37/34*     (2006.01)
    *C23C 14/18*     (2006.01)

(56) References Cited

U.S. PATENT DOCUMENTS

| | | | |
|---|---|---|---|
| 2006/0169577 A1 | 8/2006 | Takagi et al. | |
| 2007/0240981 A1* | 10/2007 | Schlott | C23C 14/3414 204/298.13 |
| 2008/0131308 A1 | 6/2008 | Tsubota et al. | |
| 2013/0264200 A1* | 10/2013 | Schlott | C23C 14/3414 204/298.13 |
| 2017/0233863 A1* | 8/2017 | Toshimori | C22F 1/14 428/220 |

FOREIGN PATENT DOCUMENTS

| Country | Publication No. | Date | Classification |
|---|---|---|---|
| JP | 2013144823 A * | 7/2013 | B21B 3/00 |
| JP | 2014173158 A * | 9/2014 | C22C 5/06 |
| WO | WO-2007045387 A1 * | 4/2007 | B22F 3/15 |

OTHER PUBLICATIONS

International Search Report dated Feb. 14, 2017 from PCT/EP2016/076909.

* cited by examiner

SILVER ALLOY-BASED SPUTTER TARGET

This application is a 371 of PCT Patent Application Serial No. PCT/EP2016/076909 filed Nov. 6, 2016, which claims priority to European Patent Application Serial No. 15193862.8 filed Nov. 10, 2015, the contents of which are incorporated by reference herein.

The present invention relates to a sputtering target comprising a silver alloy for depositing agglomeration-resistant layers, and to a production method for this sputtering target.

Due to good reflection properties, silver is a common coating material in the fields of optical data storage, display applications and optoelectronics. Depending on the application environment and other abutting layers, silver tends toward corrosion, which can result in impairment of the reflection properties and even failure of the component.

Silver layers experience a further limitation in use, since increased temperatures during the deposition and/or in subsequent process steps (such as temperatures of more than 200° C.) can considerably damage the optical and/or electrical properties of the silver layer due to agglomeration. Agglomeration manifests itself in a sudden increase in the haze value (diffuse light scattering) as well as a severe drop in reflection and in electrical conductivity.

It is known that the corrosion properties can be improved when alloying elements such as indium, bismuth, antimony or tin are added to the silver, see EP1489193. EP 2487274 A1, for example, describes a silver alloy comprising up to 1.5 wt % indium and having an average grain size in the range of 150 to 400 μm. U.S. Pat. No. 7,767,041 describes bismuth-containing silver alloys.

JP 2000-109943 describes silver alloys containing 0.5 to 4.9 at % palladium. US 2004/0048193 improves the corrosion stability through the addition of samarium.

EP 1 736 558 describes a silver alloy for use as a reflective coating. This silver alloy comprises at least two alloying elements, wherein the first alloying element is aluminum, indium or tin, and the second alloying element can be selected from a plurality of further metallic elements.

Improving the agglomeration resistance is solved in U.S. Pat. No. 7,413,618 through the addition of Ga and rare earths, or Cu, Sn. An improvement in the corrosion stability and agglomeration resistance is achieved by sputtering the preferred alloy composition.

An improvement in the corrosion and temperature stability of printed conductive pastes with respect to resistivity is achieved by silver alloys that comprise, among other things, Sn, Pb, Zn, In, Ga and, as a further element, for example, Al, Cu or titanium, see US 2005/0019203.

Solutions for improving the agglomeration resistance of silver layers are known for CD "recording layers." JP 2004-0002929 describes silver comprising Ti, Zr, Hf, V, Nb, Ta, Cr, Mo, W, Fe, Ru, Co, Rh, Ir, Ni, Pd, Pt, Cu, Au, At, Zn, Al, Ga, In, Si, Ge, Sn (0.1 to 8 at %). EP 1889930, EP 1889931, EP 1889932 and EP 18889933 report of similarly comprehensive substance systems up to 20 at % for improving the agglomeration resistance. Likewise, U.S. Pat. No. 6,896,947 describes a layer system for optical recording layers which comprises a silver alloy. U.S. Pat. No. 5,853,872 improves the agglomeration resistance of silver in particular by adding refractory metals to the alloy, although this does not deliberately control the corrosion stability. US 2007/0020138 enhances the agglomeration resistance of silver through the addition of Mo or Ni and indium.

In summary, it can be noted with respect to the additions to the alloy that, on the one hand, the corrosion stability and agglomeration resistance can be enhanced with increasing amounts of certain elements, but that on the other hand the risk that the reflection properties are adversely affected, and that the electrical conductivity decreases, increases as well. In multi-substance systems, and in particular those that do not have solid solution formation, an even distribution of the elements is important.

In principle, such reflective layers can be applied to a substrate by way of different coating methods. A preferred method is sputtering, wherein sputtering targets are used. As is known to a person skilled in the art, a sputtering target is understood to mean the material of a cathode sputtering system to be sputtered.

The desired properties of the coating to be produced must be taken into consideration in the chemical composition of the sputtering targets. If, for example, a silver-based reflective coating having high corrosion and agglomeration stability is to be produced by way of the sputtering process, the sputtering target can be composed of a silver alloy comprising corrosion-inhibiting and agglomeration-inhibiting alloying elements.

One important criterion that a sputtering target should usually meet is a very constant sputtering rate, so as to enable the formation of a coating having preferably minimized layer thickness fluctuations. High layer thickness fluctuations also adversely affect the reflection characteristics of a silver coating, among other things. Especially in the case of thin layers that are to exhibit transparency as well, a high level of layer thickness uniformity, and thus a homogeneous sputtering behavior, are important. Uniform sputtering behavior additionally promotes high target utilization, and thus increases the efficiency of the process.

Furthermore, a suitable sputtering target should allow deposition at the lowest possible arc rate. "Arcing" refers to local spark discharges on the sputtering target. The spark discharge causes the sputtering target material to fuse locally, and small splashes of this fused material can reach the substrate to be coated and generate defects there.

Therefore, the sputtering target material must be such that the material not only provides the desired end properties of the coating that is to be applied (such as good reflection properties or conductivity, yet the highest possible corrosion and agglomeration stability), but also has a constant sputter rate, a uniform layer composition and the lowest possible arcing, so as to minimize the layer thickness fluctuation and the number of defects in the coating. An improvement in one aspect (for example, optimizing the layer properties with respect to the planned application) should not come at the expense of the second aspect (good sputtering properties to as great an extent as possible). However, in practice it frequently proves to be difficult to satisfy both aspects simultaneously.

It is an object of the present invention to provide a sputtering target by way of which a silver-based reflective coating, which is as aging-resistant as possible and agglomeration-resistant at elevated temperatures, can be produced with low layer thickness fluctuation and low arcing.

It is a further object of the present invention to provide a suitable method for producing such a sputtering target.

The object is achieved by a sputtering target, comprising a silver alloy containing
  a first element, selected from indium, tin, antimony and bismuth, in an amount of 0.01 to 2.0 wt. %, based on the total weight of the silver alloy, and
  0.01 to 2.0 wt. % titanium, based on the total weight of the silver alloy, and
  having an average grain size of no more than 55 μm.

The sputtering target according to the invention allows a reflective coating having high corrosion stability to be produced. Within the scope of the present invention, surprisingly, it was found that very low arcing rates and a very constant sputter rate, and thus very low layer thickness fluctuation, can be achieved in the deposited coating, despite the titanium content in the silver alloy of the sputtering target, when the silver alloy has an average grain size of no more than 55 μm.

The silver alloy of the sputtering target preferably has an average grain size in the range of 1 to 55 μm, more preferably 3 to 50 μm, and still more preferably 5 to 45 μm or 5 to 30 μm.

The silver alloy preferably comprises the indium, tin, antimony or bismuth in an amount of 0.1 to 1.0 wt. %, and titanium in an amount of 0.1 to 1.0 wt. %, based on the total weight of the silver alloy. Optionally, the silver alloy may contain one or more additional elements, wherein these additional elements are preferably selected from indium, tin, antimony or bismuth, with the proviso that the additional element differs from the first element. If one of these additional elements is present, it is preferably present in an amount of 0.01 to 2.0 wt. %, based on the total weight of the silver alloy. If two or more of these additional elements are present, it may be preferred for the total amount thereof to be in the range of 0.01 to 4.0 wt. %, and more preferably 0.01 to 2.0 wt. %, based on the total weight of the silver alloy.

The silver alloy preferably comprises only the above-described alloying elements, the remainder being silver and unavoidable impurities.

For the indium-containing silver alloy, it is thus preferred that this alloy comprises indium and titanium, and optionally one or more of the elements Bi, Sb and Sn, the remainder being silver and unavoidable impurities.

For the antimony-containing silver alloy, it is thus preferred that this alloy comprises antimony and titanium, and optionally one or more of the elements Bi, In and Sn, the remainder being silver and unavoidable impurities.

For the bismuth-containing silver alloy, it is thus preferred that this alloy comprises bismuth and titanium, and optionally one or more of the elements Sb, In and Sn, the remainder being silver and unavoidable impurities.

For the tin-containing silver alloy, it is thus preferred that this alloy comprises tin and titanium, and optionally one or more of the elements Sb, In and Bi, the remainder being silver and unavoidable impurities.

All these unavoidable impurities may be metallic impurities.

Preferably, the unavoidable impurities are kept to a minimum and, in sum, are preferably present in an amount of less than 0.5 wt. %, and more preferably less than 0.05 wt. %.

This can be ensured, for example, when the starting metals that are used for producing the silver alloy already have a sufficiently high purity. The quantity details refer to the total weight of the silver alloy.

The sputtering properties of the silver alloy can be further optimized when the grains of the silver alloy have a certain axial ratio. In a preferred embodiment, the grains of the silver alloy have a preferred mean axial ratio of at least 40% to a maximum of 100%.

In addition, the sputtering properties of the silver alloy can be further optimized when the grains of the silver alloy have as low a grain size variation as possible. Preferably, the silver alloy of the sputtering target has a grain size variation of less than 33%, more preferably less than 15%, and still more preferably less than 12%.

Since the silver alloy of the sputtering target is a crystalline material, X-ray diffraction reflections are correspondingly found in the X-ray diffraction. The intensity of the respective X-ray diffraction reflections describes preferred orientations in the crystal lattice and textures of the alloy. In a preferred embodiment, the variation of the ratio of the intensity of the second most intensive X-ray diffraction reflection to the intensity of the most intensive X-ray diffraction reflection is less than 35%. It has been shown that silver indium titanium alloys that satisfy this condition are very advantageous for a constant sputter rate.

Ti-containing inclusions may be present in the silver alloy of the sputtering target according to the invention. These inclusions are present in the form of a separate phase. In this case, the silver alloy is a multi-phase alloy. Such a multi-phase alloy is formed by a matrix phase, which comprises silver, the first element (In, Sb, Sn or Bi) and optionally Ti, as well as optionally one or more of the additional elements, and forms Ti-containing inclusions that are distributed in this matrix. As described above, the silver alloy of the sputtering target comprises the titanium in an amount of 0.01 to 2.0 wt. %. If the silver alloy comprises Ti-containing inclusions, the titanium of the silver alloy can be present both in the matrix phase (which is to say together with Ag and In (alternatively: Bi, Sb or Sn), forming the matrix) and in the inclusions. As an alternative, it is also possible for the titanium of the silver alloy to be present only in the inclusions. The Ti-containing inclusions can, optionally, also comprise Ag as a further metallic element, for example in the form of an Ag Ti alloy or an intermetallic compound (such as TiAg). The Ti-containing inclusions can be purely metallic inclusions. As an alternative, the inclusions can comprise Ti-containing inclusions, for example in the form of oxides or nitrides (which is to say Ti-containing inclusions that are partially or completely oxidized or nitrided).

If Ti-containing inclusions are present, the number thereof per $\mu m^2$ is preferably 0.1 to 5.

The Ti-containing inclusions preferably have an average size of smaller than 5 μm, and more preferably smaller than 2 μm.

Within the scope of the present invention, it is also possible, as an alternative, for the silver alloy of the sputtering target to be a single-phase alloy. In a preferred embodiment, however, the silver alloy comprises the above-described Ti-containing inclusions and, thus, is preferably present as a multi-phase alloy (which is to say matrix phase comprising Ti-containing inclusions dispersed therein).

The sputtering target is preferably made of the above-described silver alloy.

Depending on the application, the geometry of the sputtering target may vary. For example, the sputtering target can be planar (such as in the shape of a round disk or a polygonal plate), cylindrical or tubular.

Depending on the planned application, the dimensions of the sputtering target can also vary across a wide range. For example, the planar sputtering target can have a surface area in the range of 0.5 m² to 8 m². The tubular sputtering target can have a length in the range of 0.5 to 4 m, for example.

If necessary, the sputtering target can also be applied to a substrate, for example to a back plate. The bonding of the sputtering target to the substrate can take place, for example, by way of solder (such as indium). A form-fit application to a back plate is also possible. This is generally known to a person skilled in the art.

In a further aspect, the present invention relates to a method for producing the above-described sputtering target, in which a melt containing silver, titanium, and the first element, which is selected from indium, antimony, tin and bismuth, is allowed to solidify so as to obtain a shaped body, the shaped body is heated to a forming temperature of at least 200° C. and then subjected to at least one forming step, and the shaped body is additionally subjected to at least one recrystallization step.

As was already mentioned above, optionally, at least one additional element, which is selected from indium, bismuth, tin or antimony, can also be added.

The melt can be produced by way of common methods known to a person skilled in the art, for example in an induction melting furnace (such as a vacuum induction melting furnace). For this purpose, the metals can be placed into the melting furnace in suitable amounts and be fused. So as to minimize the amount of undesirable impurities to as great an extent as possible, it may be advantageous to use the starting metals already in sufficiently high purity, for example of at least 99.5%. The melting operation is usually carried out under vacuum and/or an inert gas atmosphere (such as argon).

Thereafter, the melt can be poured into a mold or die (such as a graphite mold). If the melt is allowed to cool and solidify in this mold, a solid shaped body is obtained.

As mentioned above, the shaped body is heated to a forming temperature of at least 200° C. and is then subjected to at least one forming step. Moreover, the shaped body is subjected to at least one recrystallization step. As will be described in greater detail hereafter, the recrystallization step can take place during the forming process. However, it is also possible for the recrystallization step to be carried out after the forming process. Furthermore, it is possible for a recrystallization step to be carried out not only during the forming process, but also after the forming process.

The forming process can take place, for example, by way of rolling, forging, compressing, stretching, extruding or pressing, or a combination of two or more of these forming processes. These forming process are known per se to a person skilled in the art.

In principle, it is possible within the scope of the method according to the invention that the forming operation takes place in only a single forming step (such as a rolling step). As an alternative, it may be preferred that at least two, and more preferably at least 4, forming steps (preferably rolling steps) are carried out, such as 2 to 20 or or 8 to 15 forming steps (preferably rolling steps).

If two or more rolling steps are carried out, the rolling direction in each subsequent rolling step can correspond to the rolling direction of the preceding rolling step, or be rotated by approximately 180°. Alternatively, it is also possible that, in the case of two or more rolling steps, cross-rolling takes place, which is to say in each subsequent rolling step, the respective rolling direction is rotated by approximately 90° in relation to the preceding rolling step (either clockwise or counterclockwise). It is also possible for the rolling direction to be rotated in each rolling step by approximately 360°/n in relation to the preceding rolling step (either clockwise or counterclockwise), wherein n is the number of rolling steps.

Within the scope of the present invention, it has proven advantageous if each forming step is preferably carried out at a forming rate c of at least 1 The upper limit of the forming rate is not critical. However, for process-related reasons, it may be advantageous if the forming rate does not exceed a value of 20 s⁻¹ or 15 s⁻¹.

As is known to a person skilled in the art, the forming rate is calculated according to the following equation:

$$\varepsilon = \frac{2\pi n}{60\sqrt{r'}} \cdot \sqrt{\frac{R}{H_0}} \cdot \ln\left(\frac{1}{1-r'}\right)$$

where n is the rotational speed of the roll;
$H_0$ is the thickness of the shaped body prior to the rolling step;
r'=r/100 where r=reduction of the thickness of the shaped body per rolling step; and
R is the roll radius.

Based on the skilled practitioner's expert knowledge, this person can thus readily carry out a rolling step such that a predefined forming rate is achieved, by predefining the reduction in thickness per rolling step.

In the method according to the invention, the shaped body is subjected to at least one recrystallization step. This can be a dynamic or static recrystallization step. As is known to a person skilled in the art, dynamic recrystallization takes place during forming. No forming takes place during static recrystallization. A skilled practitioner, based on this person's general knowledge in the art, will be readily able to determine the recrystallization temperature of a given alloy under certain process conditions.

Preferably, the shaped body is subjected to at least one dynamic recrystallization step (which is to say during forming, this being while the shaped body is being subjected to one or more forming steps) and to at least one static recrystallization step.

The forming temperature to which the shaped body is heated prior to forming is preferably at least 600° C., and particularly preferably at least 750° C., or even at least 900° C. Within the scope of the present invention, the shaped body can also be further actively heated (for example by way of an external heat source) during forming. However, if the shaped body does not cool down significantly during forming, further active heating by way of an external heat source is not necessary during the forming steps.

In principle, the method according to the invention can also comprise one or more cold forming steps. As an alternative, it is possible that the method according to the invention does not comprise cold forming.

The static recrystallization step preferably takes place after forming by annealing the formed shaped body. The annealing temperature is preferably at least 600° C., and particularly preferably at least 750° C., or even at least 900° C. The duration of the annealing step can vary across a wide range. An annealing duration of 0.5 to 5 hours shall be mentioned by way of example.

The forming and, where it is carried out, the static recrystallization after forming can take place under vacuum, in an inert gas atmosphere (such as nitrogen) or in air.

Following the static recrystallization (for example by way of the above-described annealing), the shaped body can be allowed to cool. As an alternative, it may be preferred that the shaped body is quenched following the static recrystallization step, for example by immersion in a water bath or oil.

In a further aspect, the present invention relates to the use of the above-described sputtering target for producing a reflective layer.

This may be the reflective layer in a display or a monitor, for example. Due to the high quality and very low layer thickness fluctuation, the reflective layer can also be used in flexible displays or monitors.

The invention will be described in greater detail based on the following examples.

EXAMPLES

I. Measuring Methods

The parameters to which reference is made in the present application are determined by way of the following measuring methods. For the optical determinations by way of SEM and light microscope, the samples were embedded in a resin and microsectioned using increasingly finer grain sizes of 120 to 4000 and, in the final step, polished with diamond paste. Thereafter, the surface of the samples was etched with hydrogen peroxide/ammonia at 25° C. for 60 s.

Average Grain Size and Average Size of the Ti-Containing Inclusions

The average grain size M was determined by way of the line-intercept method (DIN EN ISO 643) based on the following equation:

$$M=(L*p)/(N*m)$$

where
L: length of the measuring line
p: number of the measuring lines
N: number of intercepted bodies
m: magnification The values were determined in 3*3=9 different measuring points, each at 3 depths (for this purpose, the corresponding amounts of material were cut off the targets): 0 mm, 3 mm and 6 mm. Thereafter, the arithmetic mean from the 9 measurement results is found.

The average size of the Ti-containing inclusions was likewise determined according to the above-described line-intercept method.

Grain Size Variation

From the grain sizes M, it is possible to determine the variation in accordance with the two following equations (as value A1 or alternatively as value B1):

$$A1=(M_{max}-M_{ave})/M_{ave}*100$$

$$B1=(M_{ave}-M_{min})/M_{ave}*100$$

where
$M_{max}$: maximum value of the grain sizes of all measurements
$M_{min}$: minimum value of the grain sizes of all measurements
$M_{ave}$: average grain size of all measurements Within the scope of the present application, the higher of the two values (A1 or B1) is used to establish the upper limit of the grain size variation.

Mean Axial Ratio (in %) of the Grains

For the determination of the mean grain axial ratio, the height (maximum dimension of a grain in the thickness direction (which is to say perpendicular to the sputtering surface) of the sputtering target) and the width (maximum dimension of a grain perpendicular to the thickness direction or parallel to the sputtering surface) of grains are determined. For the grains, the respective value of the quotient of grain height to grain width and finally the mean value of these quotient values are calculated.

The procedure for determining the height and width of grains is as follows: A section is prepared from the sputtering target perpendicular to the sputtering surface. On this section, at least two random surface areas, each having at least 40 grains, are selected. For each of these grains, the height thereof (which is to say maximum dimension) and the width thereof (which is to say minimum dimension) are determined. This was done by way of a light microscope (Olympus PMG3) having a size scale. The value of the quotient of height and width is found for each of the grains. From these quotient values, the mean value is calculated.

Distribution of the Ti-Containing Inclusions

The number of the Ti-containing inclusions was determined in 4 different locations of the target by way of etched microsections. For this purpose, the so-called point count method (DIN EN ISO 643) was employed. The number of the titanium bodies within a surface area of 50*50 $\mu m^2$ was counted on light microscopy images under the light microscope (Olympus PMG3). The selected magnification was 500-fold. The grain count was converted per image section per $\mu m^2$ and expressed across 10 different sampling points as an arithmetic mean with a standard deviation.

Variation of the Intensity Ratio of the Second Most Intensive X-Ray Diffraction Reflection to the Most Intensive X-Ray Diffraction Reflection X-ray diffraction measurements are carried out on the sputtering target in 5 different locations using a two-circle goniometer Stadi P from Stoe company in the transmission mode with CuK alpha 1 radiation, between 2 theta 10-105°, increment 0.03°, measured surface area approximately 10 $mm^2$.

For each X-ray diffraction measurement, the intensity $I_2$ (according to peak height) of the second most intensive diffraction reflection and the intensity $I_1$ (peak height) of the most intensive diffraction reflection are determined, and the intensity ratio $R=I_2/I_1$ is found based on these values. Thereafter, the arithmetic mean from the 5 measurement results is found.

The variation of the intensity ratio can be determined in accordance with the two following equations (as value A2 or alternatively as value B2):

$$A2=(R_{max}-R_{ave})/R_{ave}*100$$

$$B2=(R_{ave}-R_{min})/R_{ave}*100$$

where
$R_{max}$: maximum value of the intensity ratios
$R_{min}$: minimum value of the intensity ratios
$R_{ave}$: mean value of the intensity ratios R Within the scope of the present application, the higher of the two values (A2 or B2) is used to establish the variation of the X-ray diffraction intensity ratio.

Optical Reflection of the Layer Deposited by Way of Sputtering

The measurement of the direct reflection (angle of incidence and angle of reflection are the same) before and after aging at 300° C., 30 min under nitrogen (Nabertherm N 150 furnace) took place on the coated glass substrates using Perkin Elmer Lambda 35.

Layer Thickness of the Layer Deposited by Way of Sputtering

The layer thicknesses were measured by way of a stylus-type profilometer, such as Ambios Technology XP-200. The sample preparation was carried out by partially covering the substrate with Kapton tape, and the correspondingly covered region is not sputtered. After the covering is removed, the layer thickness at the created step between the coated and non-coated regions can be ascertained. The diamond needle of the measuring device measures the layer thickness by way of the deflection. The device was calibrated to 10 μm using the supplied standard. The measurement was repeated in 10 different locations of the sample, and the mean value was found.

Aging for the Determination of the Sheet Resistance

So as to measure the aging stability or agglomeration resistance, under thermal load, of the layers sputtered with the targets from the different example, glass substrates coated with 35 nm were aged in a Nabertherm N 150 furnace in air. The aging was carried out at temperatures between 100 and 300° C. in 10° increments. For this purpose, the samples were each placed for 10 min per temperature step in air into the furnace, which had been preheated to the corresponding temperature. The measuring step was always carried out on the same sample. The furnace was preheated for a minimum of 30 min so as to achieve temperature constancy, and only then were the samples placed in the furnace. After the samples were removed from the furnace, the samples were cooled on an $Al_2O_3$ plate.

Aging for the Determination of Direct Reflection

So as to measure the aging stability of the layers sputtered with the targets from the different example, glass substrates coated with 35 nm were aged in a Nabertherm N 150 furnace under nitrogen at 300°. The samples were placed in the preheated furnace and aged for 30 min. After the samples were removed from the furnace, the samples were cooled on an $Al_2O_3$ plate in air.

Resistivity:

The sheet resistance of the samples aged in air was measured using a four point probe from Nagy company, type SD 510, at room temperature on 10 respective samples. The arithmetic mean was determined. The resistivity of the layer is calculated by multiplying the sheet resistance by the layer thickness and has the unit μΩcm.

Amounts of in, Bi, Sb, Sn, Ti in the Silver Alloy

The respective content of these elements in the silver alloy can be determined by way of ICP-OES.

II. Production of Sputtering Targets

Example 1: Production of a Sputtering Target Composed of a Silver Alloy Comprising 0.5 wt. % Indium and 0.14 wt. % Titanium Silver, indium and titanium, each having a purity of 99.9%, were placed in a vacuum induction melting furnace in amounts corresponding to the predefined end composition and were melted at 1200° C. and $10^{-1}$ mbar (initial weight: 950 kg). The melt was poured into a steel casting mold, and the melt was allowed to solidify.

The resultant shaped body was preheated to 750° C. (1 hour). The forming took place in 13 rolling steps in accordance with Table 1. The thickness of the shaped body prior to rolling and after each rolling step, and the respective thickness reduction and forming rate, are indicated in Table 1 by way of example for rolling steps 1 to 4 and 10 to 13. The forming rates for the respective rolling steps 1 to 13 ranged from 1.3 to 2.6 $s^{-1}$. The total forming degree was 87%.

TABLE 1

Thickness, thickness reduction and forming rate in Example 1

| Rolling step | Thickness [mm] | Thickness reduction [mm] | Thickness reduction [%] | Forming rate [1/s] |
| --- | --- | --- | --- | --- |
| 0 (i.e., prior to rolling) | 155 | 0 | 0 | |
| 1 | 128 | 27 | 17.4 | 1.3 |
| 2 | 105 | 23 | 18.0 | 1.5 |
| 3 | 86 | 19 | 18.1 | 1.6 |
| 4 | 70 | 16 | 18.6 | 1.8 |
| 10 | 26 | 4 | 13.3 | 2.6 |
| 11 | 23 | 3 | 11.5 | 2.6 |
| 12 | 21 | 2 | 8.7 | 2.3 |
| 13 | 20 | 1 | 4.7 | 1.7 |

As was already mentioned above, the forming rate is calculated in the known manner in according to the following equation:

$$\varepsilon = \frac{2\pi n}{60\sqrt{r'}} \cdot \sqrt{\frac{R}{H_0}} \cdot \ln\left(\frac{1}{1-r'}\right)$$

where n is the rotational speed of the roll;

$H_0$ is the thickness of the shaped body prior to the rolling step;

r'=r/100 where r=reduction of the thickness of the shaped body per rolling step; and R is the roll radius.

In Example 1, forming rates for the respective rolling steps 1 to 13 of 1.3 to 2.6 $s^{-1}$ resulted for a roller speed of 15 rpm and a roller radius of 1050 mm. The forming degrees of the respective rolling steps ranged from 5 to 18%.

After the last rolling step, a plate measuring approximately 2000*2000*20 was obtained. This plate was annealed at 800° C. for 2 hours for recrystallization.

Figure 1:
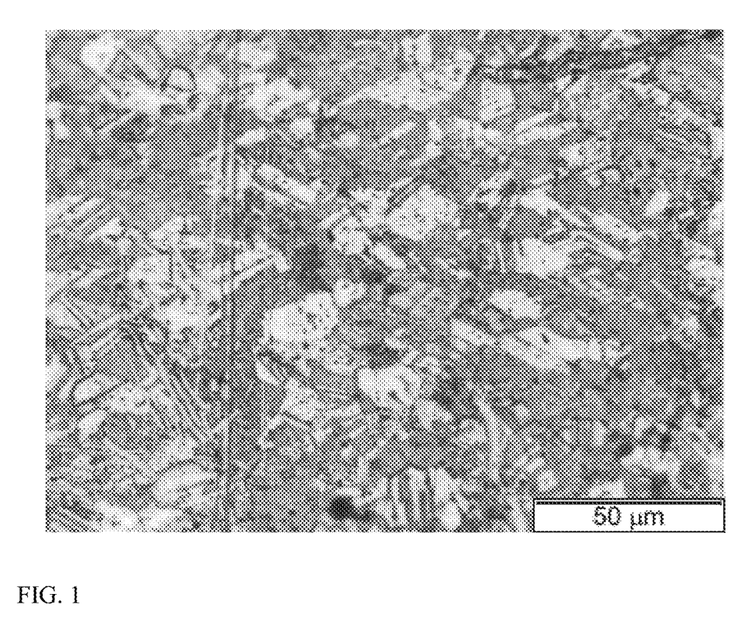
FIG. 1 is a light microscopy image of the silver alloy after etching in a 500-fold magnification for Example 1.

FIG. 1 shows a light microscopy image of the silver alloy after etching in a 500-fold magnification (section perpendicular to the sputtering surface).

Figure 2A:
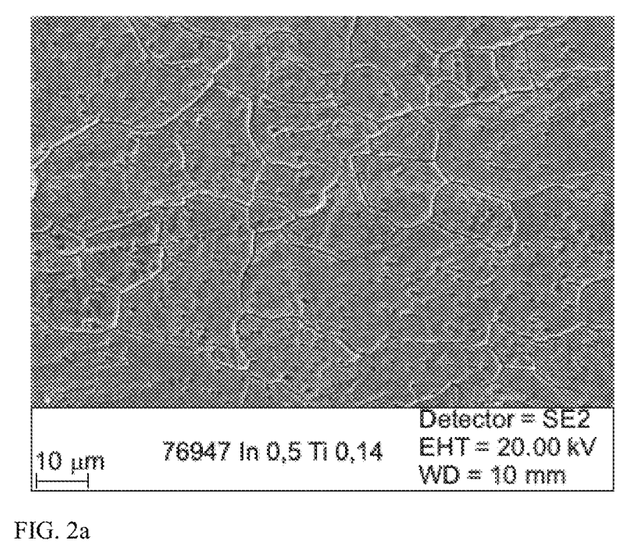
FIGS. 2a and 2b are SEM images of the silver alloy after etching for Example 1.
Figure 2B:
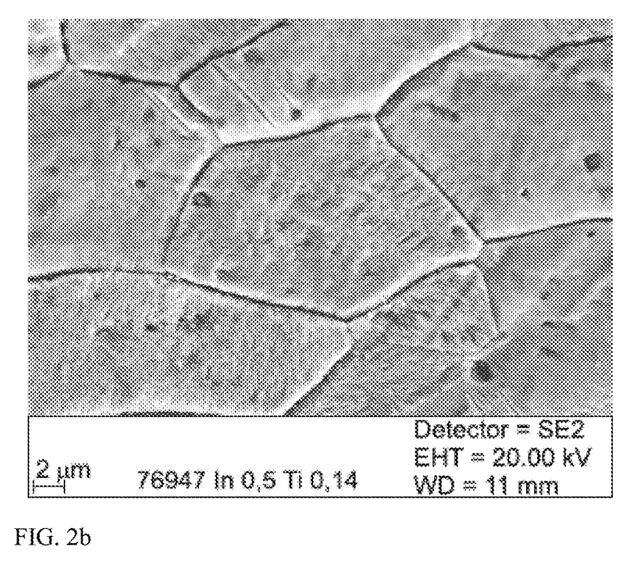

FIGS. 2a and 2b show a respective SEM image of the silver alloy after etching in different magnifications. The Ti-containing inclusions are apparent in the images in the form of dark spots. As the SEM images demonstrate, the Ti-containing inclusions have a very small average size and are very uniformly distributed in the silver alloy.

Table 2 lists X-ray diffraction reflection intensities of different lattice planes for the silver alloy and for silver as a reference material.

TABLE 2

Intensities of the lattice plane reflections AgIn0.5Ti0.14

| Lattice plane | 2 theta (in degrees) | Silver (target value) | AgIn0.5Ti0.14 |
|---|---|---|---|
| 111 | 38.12 | 100 | 100 |
| 200 | 44.28 | 40 | 19.5 |
| 220 | 64.43 | 25 | 23.7 |
| 311 | 77.48 | 26 | 10.0 |
| 222 | 81.54 | 12 | 8.0 |

The silver alloy had the following properties:
Average grain size: 8 µm
Mean axial ratio of the grains: 41%
Grain size variation: 10.1%
Variation of the intensity ratio
of the second most intensive diffraction reflection
to the most intensive diffraction reflection: 19.5%
Mean value of the titanium inclusion: 0.3+/−0.1 inclusions/µm$^2$ Thereafter, a piece of the rolled plate was mechanically worked (milled) for a sputtering experiment and bonded with indium (488*80*10 mm$^3$). The bonding takes place on a copper plate pre-wetted with indium. The rear of the target was provided with a rear-side Cr/NiV/Ag metallization.

Example 2: Production of a Sputtering Target Composed of a Silver Alloy Comprising 0.17 wt. % Indium and 0.32 wt. % Titanium Example 2 was produced exactly as Example 1 in terms of the procedure; only the amounts of the alloying elements deviate.

Figure 3:
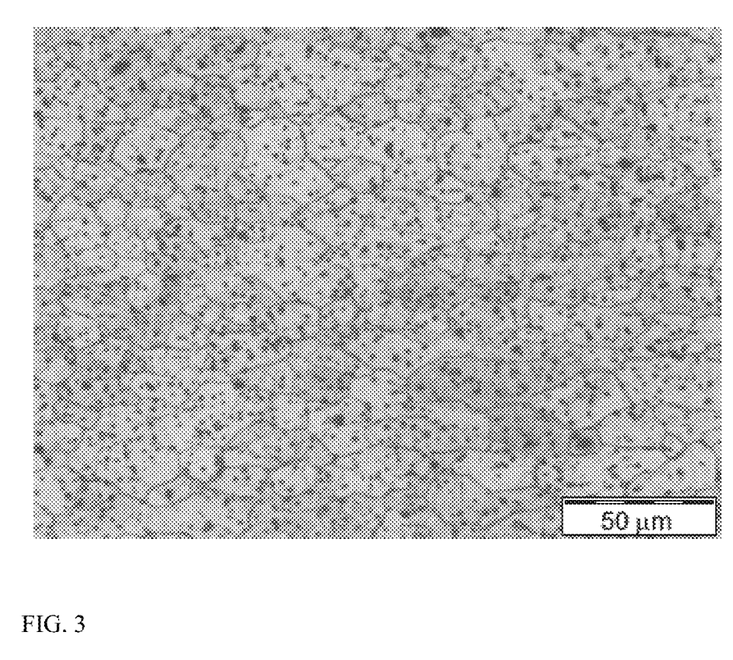
FIG. 3 is a light microscopy image of the silver alloy after etching in a 500-fold magnification for Example 2.

FIG. 3 shows a light microscopy image of the silver alloy after etching in a 500-fold magnification (section perpendicular to the sputtering surface).

Figure 4A:
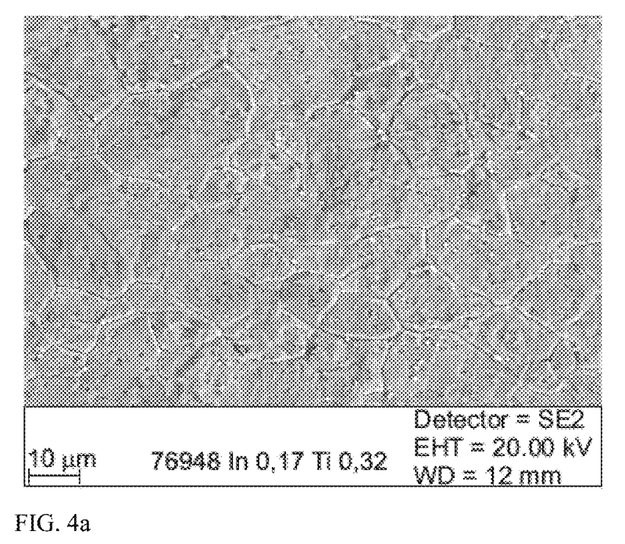
FIGS. 4a and 4b are SEM images of the silver alloy after etching in at magnifications.
Figure 4B:
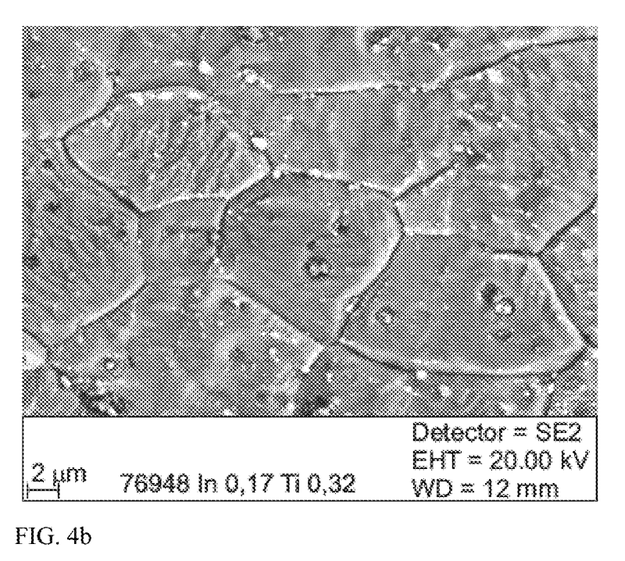

FIGS. 4a and 4b show a respective SEM image of the silver alloy after etching in different magnifications. The Ti-containing inclusions are apparent in the images. As the SEM images demonstrate, the Ti-containing inclusions have a very small average size and are distributed across all grains in the silver alloy.

Table 3 lists X-ray diffraction reflection intensities of different lattice planes for the silver alloy and for silver as a reference material.

TABLE 3

Intensities of the lattice plane reflections for AgIn0.17Ti0.32

| Lattice plane | 2 theta | Silver (target value) | AgIn0.17Ti0.32 |
|---|---|---|---|
| 111 | 38.12 | 100 | 100 |
| 200 | 44.28 | 40 | 14.9 |
| 220 | 64.43 | 25 | 20.1 |
| 311 | 77.48 | 26 | 9.7 |
| 222 | 81.54 | 12 | 6.4 |

The silver alloy had the following properties:
Average grain size: 13 µm
Mean axial ratio of the grains: 51%
Grain size variation: 30.5%
Variation of the intensity ratio
of the second most intensive diffraction reflection
to the most intensive diffraction reflection: 14.9%
Mean value of the titanium inclusion: 0.5+/−0.06 inclusions/µm$^2$ As a final step, the plate was mechanically worked as in Example 1 and bonded with indium.

Comparative Example 1: Production of a Sputtering Target Composed of a Silver Alloy Comprising 0.5 wt. % Indium and 0.14 wt. % Titanium Comparative Example 1 was produced as Example 1 in terms of the procedure, except with the following change:
Deviating from Example 1, rolling took place at room temperature using 21 passes.

The thickness of the shaped body prior to rolling and after each rolling step, and the respective thickness reduction and forming rate, are indicated in Table 4 by way of example for rolling steps 1 to 4 and 18 to 21.

TABLE 4

Thickness, thickness reduction and forming rate in Comparative Example 1

| Rolling step | Thickness [mm] | Thickness reduction [mm] | Thickness reduction [%] | Forming rate [1/s] |
|---|---|---|---|---|
| 0 (i.e., prior to rolling) | 155 | 0 | 0 | |
| 1 | 135 | 20 | 12.9 | 1.1 |
| 2 | 115 | 20 | 14.8 | 1.3 |
| 3 | 95 | 20 | 17.4 | 1.5 |
| 4 | 80 | 15 | 15.8 | 1.6 |
| 18 | 23 | 1 | 4.17 | 1.5 |
| 19 | 22 | 1 | 4.35 | 1.6 |
| 20 | 21 | 1 | 4.55 | 1.7 |
| 21 | 20 | 1 | 4.76 | 1.7 |

After the last rolling step, a plate measuring approximately 2000*2000*20 was obtained. This plate was annealed at 600° C. for 2 hours for recrystallization.

Figure 5:
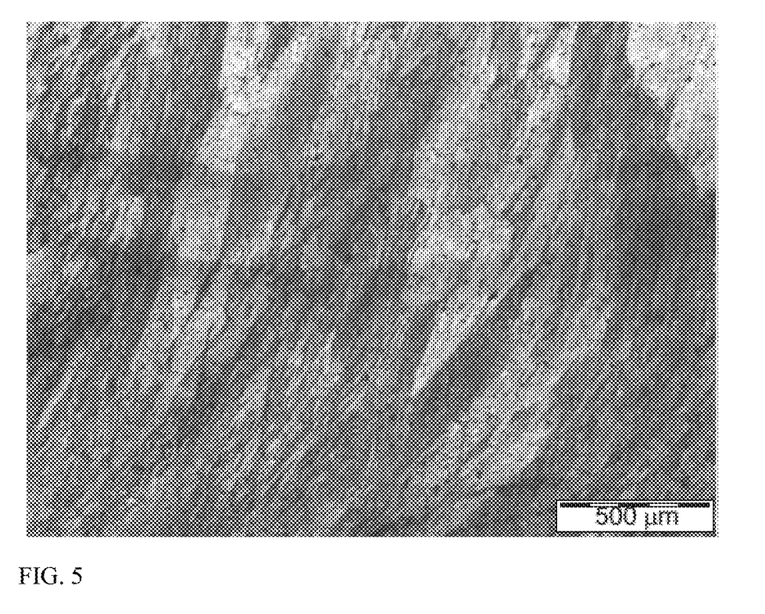
FIG. 5 is a light microscopy image of the silver alloy after etching for Example 2.

FIG. 5 shows a light microscopy image of the silver alloy after etching in a 500-fold magnification.

The silver alloy had the following properties:
Average grain size: 56 µm
Mean axial ratio of the grains: <25%
Grain size variation: >35%

As a final step, the plate was mechanically worked for sputtering as in Example 1 and bonded with indium.

III. Sputtering of Layers, Layer Properties

Using the produced sputtering targets measuring 488*80*10 mm$^3$ from the described examples and comparative examples, 35 nm coatings were sputtered onto a low-sodium glass substrate (at 500 V DC, 0.2 A, 100 W). Furthermore, additional Comparative Examples 2 and 3 were selected. For these, pure silver (Comparative Example 2) and a silver indium alloy having an indium content of 0.43 wt. % (AgIn0.43; Comparative Example 3) were selected. In both instances, the production took place analogously to Comparative Example 1. The grain sizes of the targets of Comparative Examples 2 and 3 were randomly evaluated and ranged between 5 and 80 µm. The grain was equiaxed having an axial ratio between 69% and 88%.

For Example 1, the layer showed a layer thickness deviation of less than 2%, measured at 10 points of the glass substrate. The arc rate of the target was considerably less than 1 µarc/h.

The sputtering target from Comparative Example 1 was likewise used to sputter a coating onto a glass substrate (at 500 V DC, 0.2 A, 100 W). The layer showed a layer thickness deviation of more than 8%, measured at 10 points of the glass substrate. The arc rates of Comparative Example 1 were more than 50 µarc/h.

The sheet resistance, as a function of the aging temperature, was measured for the coatings obtained with the sputtering targets from Example 2 (AgIn0.71Ti0.32) and of the Comparative Examples 2 (pure silver) and 3 (AgIn0.43; absence of titanium). The results are listed in Table 5.

Figure 6:
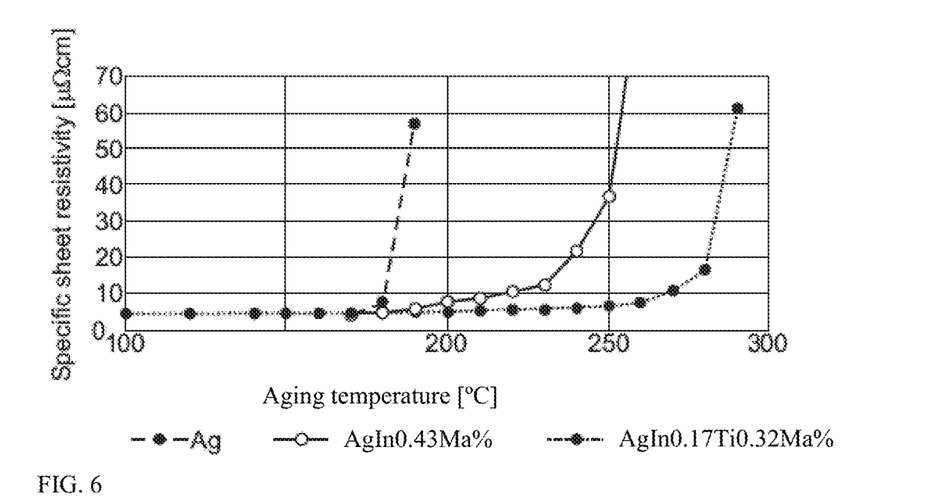
FIG. 6 is a graph of the resistivity as a function of the temperature for Ag (Comparative Example 2), AgIn0.43Ma % (Comparative Example 3) and AgIn0.17Ti0.32Ma % (Example 2)

The resistivity as a function of the temperature is also shown in FIG. 6. As can be derived from the legend of FIG. 6, this figure shows the resistivity as a function of the aging temperature for Ag (Comparative Example 2), AgIn0.43Ma % (Comparative Example 3) and AgIn0.17Ti0.32Ma % (Example 2).

The resistivity is a measure of the tendency of the layer toward agglomeration after aging (which is to say under thermal load). The coating generated with the sputtering target according to the invention shows a very significant improvement in the agglomeration resistance. Agglomeration and/or an increase in resistivity to values above 10 µΩcm only appear at a temperature above 270° C.

TABLE 5

Resistivity (in µΩcm) after thermal treatment

| Temp. | Resistivity [µΩcm] AgIn0.17Ti0.32 (coating obtained with the sputtering target from Example 2) | Resistivity [µΩcm] Ag (coating obtained with the sputtering target from Comparative Example 2) | Resistivity [µΩcm] AgIn0.43 (coating obtained with the sputtering target from Comparative Example 3) |
|---|---|---|---|
| 150 | 4.514 | 3.78 | — |
| 160 | 4.588 | 7.504 | — |
| 170 | 4.588 | 57.204 | 4.34 |
| 180 | 4.699 | — | 5.075 |
| 190 | 4.773 | — | 5.985 |
| 200 | 4.958 | — | 7.56 |
| 210 | 5.143 | — | 8.715 |
| 220 | 5.476 | — | 10.465 |
| 230 | 5.513 | — | 12.495 |
| 240 | 5.994 | — | 21.7 |
| 250 | 6.66 | — | 36.89 |
| 260 | 7.437 | — | 96.6 |
| 270 | 10.767 | — | 668.5 |
| 280 | 16.724 | — | — |
| 290 | 61.161 | — | — |

The reflection over the wavelength range of visible light (380 to 780 nm) was determined on coatings that were produced with the sputtering targets from Examples 1 and 2 and from the Comparative Example 3, and subjected to a thermal treatment (aging) at 300° C. according to the description above.

Figure 7:
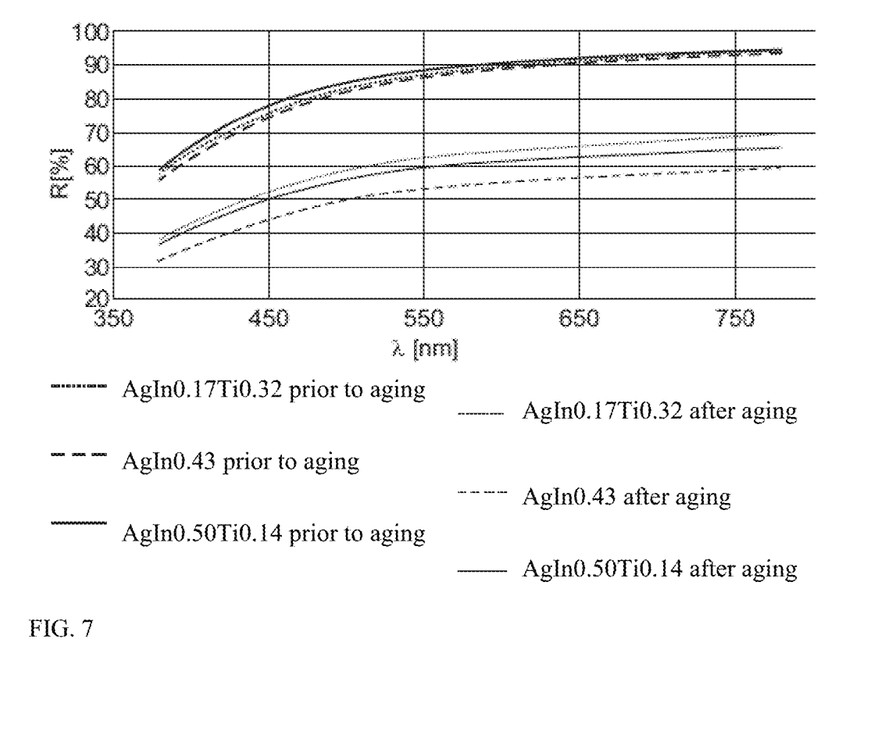
FIG. 7 is a graph of the resistivity for sputtered coatings prior to aging and after aging over the wavelength range of visible light.

The results are shown in FIG. 7. As can be derived from the legend of FIG. 7, this figure shows the reflection over the wavelength range of visible light (380 to 780 nm) for the following sputtered coatings:
AgIn0.17Ti0.32 prior to aging (top dotted line)
AgIn0.43 prior to aging (top dashed line)
AgIn0.50Ti0.14 prior to aging (top solid line)
AgIn0.17Ti0.32 after aging (bottom dotted line)
AgIn0.43 after aging (bottom dashed line)
AgIn0.50Ti0.14 after aging (bottom solid line)

Table 6 shows the reflection values at 550 nm (in %) of the respective coatings before and after annealing at 300° C.

The decreasing reflection as a consequence of the thermal treatment is an indication of the increased agglomeration here as well. Compared to the coatings obtained with the sputtering targets according to the invention from Examples 1 and 2, a considerably more drastic decrease in reflection due to the thermal treatment can be observed in the coating obtained with the sputtering target from Comparative Example 3.

TABLE 6

Reflection at 550 nm (in %) before and after annealing at 300° C.

| | Reflection [%] at 550 nm, prior to annealing | Reflection [%] at 550 nm, after annealing at 300° C. | Reduction in % |
|---|---|---|---|
| Coating produced with the sputtering target from Example 2 | 87 | 62.6 | 28.0 |
| Coating produced with the sputtering target from Example 1 | 88.2 | 59.3 | 32.7 |
| Coating produced with the sputtering target from Comparative Example 3 | 86.2 | 53.1 | 38.4 |

The surface roughness before annealing and after annealing at 300° C. was determined for the coatings deposited with the sputtering target from Example 1 and with the sputtering target from Comparative Example 3. The results are shown in Table 7.

For the surface roughness of the deposited layers measured by way of atomic force microscopy (AFM) using a Bruker Dimension 3100, it is apparent from Table 7 that, with an identical starting value for both coatings of approximately 1.1 nm after aging at 300° C., the layer obtained with the sputtering target according to the invention undergoes only a minor increase in roughness to 1.3 nm, while the roughness value for the coating produced with the sputtering target from Comparative Example 3 more than doubled. The surface roughness ratio $RR=R_{an}/R_{av}$, where $R_{av}$=Ra prior to aging and $R_{an}$=Ra after aging at 300° C., also shows this very clearly.

TABLE 7

Roughness before and after annealing at 300° C.

| Sample | $R_a$ [nm] | $R_q$ [nm] | RR |
|---|---|---|---|
| Coating, Example 1, room temperature | 1.1 | 1.4 | 1.18 |
| Coating, Example 1, aging at 300° C. | 1.3 | 2.4 | |
| Coating, Comparative Example 3, room temperature | 1.1 | 1.4 | 2.64 |
| Coating, Comparative Example 3, aging at 300° C. | 2.9 | 5.2 | |

A summary comparison of the individual examples and the sputtering and layer properties thereof in Table 8 shows particularly advantageous properties for the sputtering targets according to the invention, such as reflective coatings having a very constant layer thickness. Combined with the uniform and finely divided titanium distribution, it is also possible to keep the arc rate very low for the targets according to the invention.

TABLE 8

| Assessment of the sputtering and layer properties | | | | | |
| --- | --- | --- | --- | --- | --- |
| | Ex. 1 | Ex. 2 | Comp. Ex. 1 | Comp. Ex. 2 | Comp. Ex. 3 |
| Sputtering properties | ++ | ++ | -- | ++ | ++ |
| Evenness of layer thickness | ++ | ++ | - | ++ | ++ |
| Sheet resistance after thermal treatment | ++ | ++ | -- | -- | -- |

The invention claimed is:

1. A sputtering target, comprising a silver alloy comprising:
a first element, selected from indium, tin, antimony and bismuth, in an amount of 0.01 to 2 wt. %, based on the total weight of the silver alloy, and
0.01 to 2 wt. % titanium, based on the total weight of the silver alloy, and
having an average grain size of no more than 55 μm, and
wherein the silver alloy comprises Ti-containing inclusions located within grains of the silver alloy having an average size that is smaller than 5 μm.

2. The sputtering target according to claim 1, wherein the silver alloy comprises one or more additional elements, selected from indium, tin, antimony and bismuth, with the proviso that the first element and the additional element differ from one another, the additional element or each of the additional elements each being present in an amount of 0.01 to 2 wt. %, based on the total weight of the silver alloy.

3. The sputtering target according to claim 2, wherein the remainder of the silver alloy is silver and unavoidable impurities.

4. The sputtering target according to claim 1, wherein the silver alloy has a grain size variation of less than 35%, and/or the grains of the silver alloy have a mean axial ratio of at least 40%.

5. The sputtering target according to claim 1, wherein 0.1 to 5 said Ti-containing inclusions are present per pmt.

6. The sputtering target according to claim 1, wherein the silver alloy has a variation of an intensity ratio of the second most intensive X-ray diffraction reflection to the most intensive X-ray diffraction reflection of less than 20%.

7. A sputtering target, comprising a silver alloy comprising:
a first element, selected from indium, tin, antimony and bismuth, in an amount of 0.01 to 2 wt. %, based on the total weight of the silver alloy, and
0.01 to 2 wt. % titanium, based on the total weight of the silver alloy, and
having an average grain size of no more than 55 μm, and
wherein the silver alloy comprises Ti-containing inclusions located within grains of the silver alloy having an average size that is smaller than 2 μm.

8. The sputtering target according to claim 7, wherein the silver alloy comprises one or more additional elements, selected from indium, tin, antimony and bismuth, with the proviso that the first element and the additional element differ from one another, the additional element or each of the additional elements each being present in an amount of 0.01 to 2 wt. %, based on the total weight of the silver alloy.

9. The sputtering target according to claim 8, wherein the remainder of the silver alloy is silver and unavoidable impurities.

10. The sputtering target according to claim 7, wherein the silver alloy has a grain size variation of less than 35%, and/or the grains of the silver alloy have a mean axial ratio of at least 40%.

11. The sputtering target according to claim 7, wherein 0.1 to 5 said Ti-containing inclusions are present per $\mu m^2$.

12. A sputtering target, comprising a silver alloy comprising:
a first element, selected from indium, antimony and bismuth, in an amount of 0.01 to 2 wt. %, based on the total weight of the silver alloy, and
0.01 to 2 wt. % titanium, based on the total weight of the silver alloy, and
having an average grain size of no more than 55 μm, and
wherein the silver alloy comprises Ti-containing inclusions located within grains of the silver alloy, and 0.1 to 5 said Ti-containing inclusions are present per $\mu m^2$.

13. The sputtering target according to claim 12, wherein the silver alloy comprises one or more additional elements, selected from indium, tin, antimony and bismuth, with the proviso that the first element and the additional element differ from one another, the additional element or each of the additional elements each being present in an amount of 0.01 to 2 wt. %, based on the total weight of the silver alloy.

14. The sputtering target according to claim 13, wherein the remainder of the silver alloy is silver and unavoidable impurities.

15. The sputtering target according to claim 12, wherein the silver alloy has a grain size variation of less than 35%, and/or the grains of the silver alloy have a mean axial ratio of at least 40%.

16. The sputtering target according to claim 1, wherein the first element is indium.

* * * * *